(12) United States Patent
Cady et al.

(10) Patent No.: US 6,404,662 B1
(45) Date of Patent: Jun. 11, 2002

(54) RAMBUS STAKPAK

(75) Inventors: James W. Cady; Russell Rapport, both of Austin, TX (US)

(73) Assignee: Staktek Group, L.P., Austin, TX (US)

( * ) Notice: Subject to any disclaimer, the term of this patent is extended or adjusted under 35 U.S.C. 154(b) by 0 days.

(21) Appl. No.: 09/646,724

(22) PCT Filed: Mar. 23, 1998

(86) PCT No.: PCT/US98/27873

§ 371 (c)(1),
(2), (4) Date: Mar. 7, 2001

(87) PCT Pub. No.: WO99/49468

PCT Pub. Date: Sep. 30, 1999

(51) Int. Cl.[7] .................................................. G11C 5/06
(52) U.S. Cl. ............................ 365/63; 365/52; 257/686
(58) Field of Search ...................... 365/63, 52; 257/686, 257/723, 724, 726, 727

(56) References Cited

U.S. PATENT DOCUMENTS

| | | | | | |
|---|---|---|---|---|---|
| 3,746,934 A | * | 7/1973 | Stein | ................... | 317/101 CM |
| 4,884,237 A | * | 11/1989 | Mueller et al. | ............. | 257/686 |
| 5,631,193 A | * | 5/1997 | Burns | .......................... | 29/827 |
| 6,118,176 A | * | 9/2000 | Tao et al. | ................... | 257/676 |
| 6,205,654 B1 | * | 3/2001 | Burns | .......................... | 29/830 |
| 6,242,285 B1 | * | 6/2001 | Kang | .......................... | 438/109 |
| 6,252,299 B1 | * | 6/2001 | Masuda et al. | ............. | 257/686 |

* cited by examiner

*Primary Examiner*—Richard Elms
*Assistant Examiner*—Tuan T. Nguyen
(74) *Attorney, Agent, or Firm*—J. Scott Denko; George & Donaldson, L.L.P.

(57) ABSTRACT

The RAMBUS compatible configuration of the present invention is achieved by stacking one of the two modules in the stacked configuration in an upside-down position with respect to the other. This way, the corresponding electrical leads of each memory module will extend on opposite sides of the stacked package and will be securably connected to vertical rails. The vertical rails are electrically and securably connected to the bonding pads which electrically connect to the RAMBUS signal channel. In this embodiment, the electrical leads of one memory module electrically connect to the signal channel at points located on one side of the stacked package and the electrical leads of the other memory module connect to the signal channel at points located on the opposite side of the stacked package. The resulting distance between the points of contact between corresponding leads of each memory module in the stacked package is sufficient to satisfy the requirements of the RAMBUS signal channel. Therefore, two memory modules can be vertically stacked to achieve higher memory density and thereby conserve board space.

6 Claims, 8 Drawing Sheets

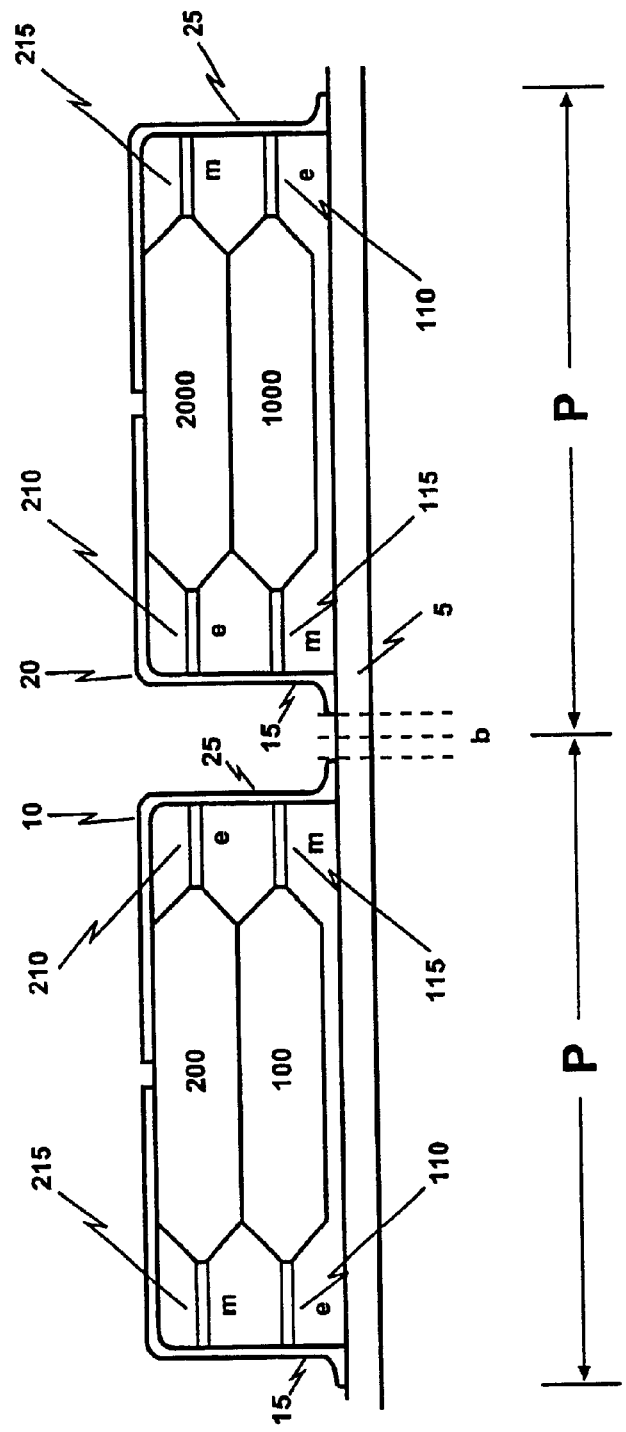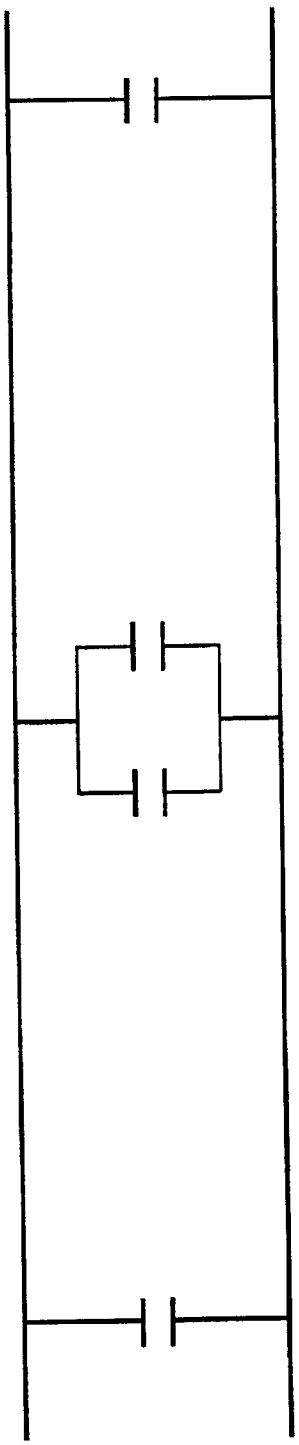

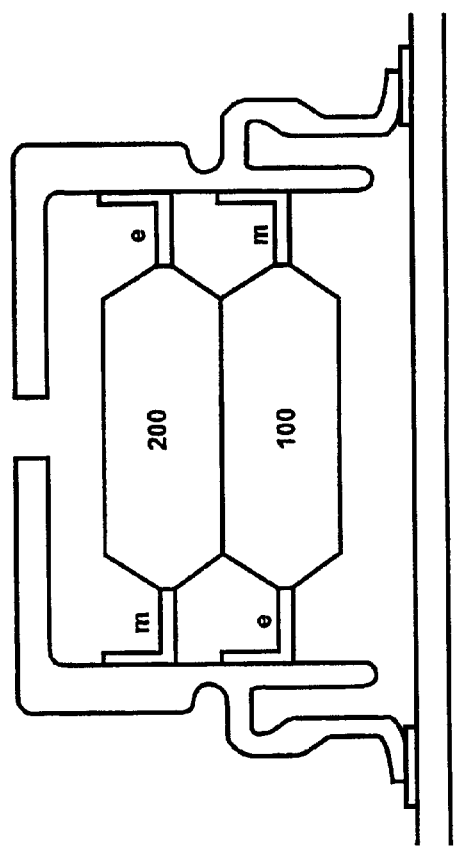
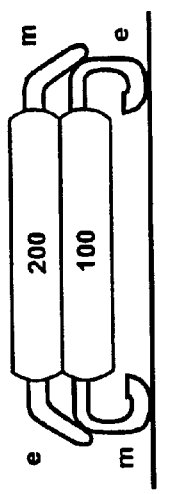
Fig. 7

RAMBUS STAKPAK

TECHNICAL FIELD

The present invention relates to methods and apparatus for achieving a stacked configuration of memory modules that conforms to a RAMBUS specification.

BACKGROUND OF THE INVENTION

Recent developments in Dynamic Random Access Memory (DRAM) design, as disclosed by RAMBUS, Inc. in U.S. Pat. No. 5,511,024, have resulted in substantially increased memory accessing speeds over fewer signal lines. By multiplexing data, address, and control signals, and providing circuitry for timing control, fewer signal lines connecting DRAM to a processor or memory controller are required. This substantially reduces the cost and increases the flexibility of implementing a signal channel bus on a printed circuit board. However, to achieve high memory accessing speed, the signal lines must have a very high bandwidth in comparison to former DRAM implementations. To achieve high bandwidth, tight control over the design of the printed circuit board is required.

A segment of a typical DRAM circuit layout is shown in FIG. 1A. The controller is connected to the memory modules by a series of metal signal traces laid out on the printed circuit board. In FIG. 1A, only a few signal traces are shown. Typically, the DRAM will be connected to multiple traces as shown in FIG. 1B. These traces carry the data, address and control signals. Also, means for connecting the circuit components to power and ground are provided. The signal traces will typically converge from the pins of the controller to form a series of substantially parallel lines connecting to the leads of the DRAMs. Multiple DRAMs may be connected in parallel as shown in FIG. 1A. The controller selects the DRAM to be addressed using chip select signals. The controller may be connected to the DRAMs by way of a socket as shown. However, the socket may be omitted. Commonly the DRAMs are connected to a power plane and to a ground plane by vias, which are metallized holes drilled in the printed circuit board to connect leads to a another layer of the printed circuit board. The signal channel is terminated with termination resistors as shown.

The system utilizing DRAMS may typically be capable of transferring data at rates up to 800 MHz using both edges of a 400 MHz clock. For optimal operation, the system must present a uniform bandpass impedance to high order harmonies of the fundamental clock frequency so as to minimize the change in current on each signal trace with respect to time. In order to meet this requirement stringent constraints are placed on the design of the signal channel. A channel design that conforms to these constraints in order to operate with the above described high speed DRAMs is referred to as a RAMBUS channel.

In a RAMBUS channel layout, the channel signal layer must be directly above a ground plane layer, separated only by a dielectric, with no intervening layers. Further, no vias are allowed to connect signal traces to another layer of the board. These vias are not allowed because they deteriorate the bandwidth of the channel.

The RAMBUS specification further requires that the impedance of the channel as seen by the controller is to be in the range of 25–50 Ohms with all components installed. The impedance of the channel is determined by the trace width, the dielectric thickness, the dielectric constant, and the spacing of the DRAMs. Increasing the trace width decreases the channel impedance. Increasing the dielectric thickness or increasing the spacing between DRAMs increases the channel impedance. Each signal trace may be viewed or modelled as a transmission line with a distributed series inductance and distributed parallel capacitance. The connection of a DRAM lead to the signal trace may be viewed as placing a capacitance in parallel with the transmission line. The signal trace parameters are chosen so that the parallel combination of the transmission line impedance and the DRAM impedance is in the range of 25–50 Ohms. Formulas for deriving the impedance of the channel as a function of the trace width, dielectric thickness, and DRAM spacing have been developed and are well known in the art.

Notice, as shown in FIG. 1, that in RAMBUS applications the signal leads of the DRAM are aligned on one side of the chip and the corresponding leads on multiple DRAMs are spaced apart by an amount that is greater than the width of the DRAM. The DRAMs are typically spaced as close together as practical, given the constraint of designing the lead lengths so that the channel exhibits an impedance in the range of 25–50 Ohm, in order to conserve board space.

It would be desirable to conserve board space even further by stacking the DRAMs one on top of another. High density stacked memory modules have been developed as disclosed in U.S. Pat. Nos. 5,279,029, 5,367,766, 5,455,740, 5,484, 959 and 5,592,364, all of which are incorporated herein by reference for all purposes.

A half sectional view of a typical embodiment of a stacked package 11 is shown in FIG. 2. The memory modules 16 are stacked vertically so that the leads 14 which extend from the sides of each module are aligned in vertical columns. The leads 14 in each vertical column may be sized and formed so as to securably mate with a vertical rail 12. Each vertically oriented rail 12 may be formed of substantially planar material having perimeter edge and two planar, relatively wide, side surfaces. The leads of each vertical column mate with the edge of the rail 12. The rails electrically couple the leads to connections on the printed circuit board as at 28. The leads 14 also provide heat dissipation by conducting heat away from the stacked memory modules 16. Variations of the basic configuration shown in FIG. 2 are disclosed in the above-referenced U.S. patents.

The stacked memory module package increases the spatial density of system memory, thereby decreasing the area of printed circuit boards which must be reserved for memory. Therefore, a means for achieving a stacked memory configuration compatible with a RAMBUS channel layout is desirable to increase RAMBUS DRAM memory density and conserve space.

SUMMARY OF THE INVENTION

An object of the present invention is to provide a stacked memory configuration that is compatible with the RAMBUS channel layout. In one embodiment of the present invention, two DRAM memory modules are stacked on top of each other. The lower module has electrical leads extending from one side of the package. The upper module has electrical leads which extend from the side of the package which is opposite to the side of the package from which the electrical leads of the lower module extend. The electrical leads are electrically and securably connected to vertically oriented rails located opposite each side of the stacked memory modules. Both the upper and lower modules may have mechanical leads extending from sides of the modules opposite the sides from which the electrical leads extend. The mechanical leads provide means for mounting individual modules, and are not electrically connected to the integrated memory circuit located within the module. In one embodiment, the external portion of the mechanical leads may be connected to the vertical rails to aid in heat dissipation. In an alternative embodiment, the mechanical leads may be physically removed.

The RAMBUS compatible configuration of the present invention is achieved by stacking one of the two modules in the stacked configuration in an upside-down position with respect to the other. This way, the corresponding electrical leads of each memory module will extend on opposite sides of the stacked package and will be securely connected to vertical rails. The vertical rails are electrically and securely connected to the bonding pads which electrically connect to the RAMBUS signal channel.

In this embodiment, the electrical leads of one memory module electrically connect to the signal channel at points located on one side of the stacked package and the electrical leads of the other memory module connect to the signal channel at points located on the opposite side of the stacked package. The resulting distance between the points of contact between corresponding leads of each memory module in the stacked package is sufficient to satisfy the requirements of the RAMBUS signal channel. Therefore, two memory modules can be vertically stacked to achieve higher memory density and thereby conserve board space.

Further, multiple stacked memory modules can be added to the RAMBUS channel to achieve increased memory density while conforming to RAMBUS specifications. Moreover, the methods and apparatus of the present invention can be employed to achieve increased memory density for other high speed channels.

These and other features, aspects and advantages of the present invention will become better understood with reference to the following description, appended claims and drawings.

BRIEF DESCRIPTION OF THE DRAWINGS

FIG. 6A illustrates parallel connections of stacked memory modules according to the principals of the present invention;

FIG. 6B illustrates an equivalent circuit representative of the configuration of FIG. 6A; and FIG. 7 illustrates other configurations that may be used to implement the present invention.

DETAILED DESCRIPTION OF PREFERRED EMBODIMENTS

Figure 1A:
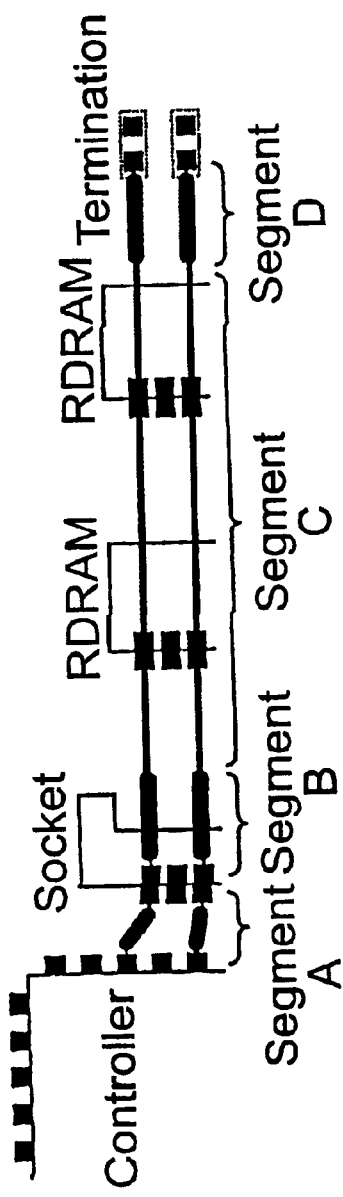
FIG. 1A is a partial schematic view of a RAMBUS channel layout.

Two alternative embodiments of the present invention are illustrated in FIGS. 3A and 3B. Two memory modules 100 and 200 are vertically stacked one upon the other in a stacked package 10 as shown. In the Figures, the mechanical leads are designated with the letter "m" and the electrical leads are designated with the letter "e" for clarity. In FIG. 3A the electrical leads 110 of the lower memory module 100 are securely connected to vertical rails 15 located on the left side of package 10. The mechanical leads 115 of the lower memory module 100 are securely connected to vertical rails 25 located on the right side of package 10. The electrical leads 210 of the upper memory module 200 in FIG. 3A are securely connected to the vertical rails 25 located on the right side of package 10. The mechanical leads 215 of upper module 200 are securely connected to vertical rails 15 located on the left side of package 10. In FIG. 3B, the orientation of electrical leads 110 and mechanical leads 115 of lower module 100 is reversed from the orientation shown in FIG. 3A. Likewise, in FIG. 3B, the orientation of electrical leads 210 and mechanical leads 215 of upper module 200 is reversed from the orientation shown in FIG. 3B. Either of the embodiments depicted in FIG. 3A or 3B may be constructed by orienting upper module 200 upside-down with respect to the orientation of lower module 100. Stated alternatively, either of the two embodiments depicted in FIG. 3A or 3B may be constructed by orienting lower module 100 upside-down with respect to the orientation of upper module 200.

Mechanical leads 115 and 215 are provided for mounting and are not internally connected to the integrated memory circuits located within memory modules 100 and 200. Mechanical leads 115 and 215 may be physically removed rather than securely connected to vertical rails 15 and 25. However, it is preferable to secure mechanical leads 115 and 215 to vertical rails 15 and 25 in order to conduct heat away from memory modules 100 and 200.

Vertical rails 15 and 25 are located on opposite sides of package 10, and are connected to points on the printed circuit board 5 that are electrically connected to RAMBUS channel traces, to form electrical connections between said traces and electrical leads 110 and 210 of modules 100 and 200. The distance denoted L in FIG. 3A between the points where vertical rails 15 contact printed circuit board 5 and the points where vertical rails 25 contact printed circuit board 5 is comparable to the width of package 10, which is itself comparable to the width of memory modules 100 and 200. This distance L makes it possible to use stacked package 10 in a RAMBUS channel while achieving the requisite 25–50 Ohm channel impedance, and allows mounting the stacked memory modules without the use of vias according to RAMBUS requirements.

Figure 1B:
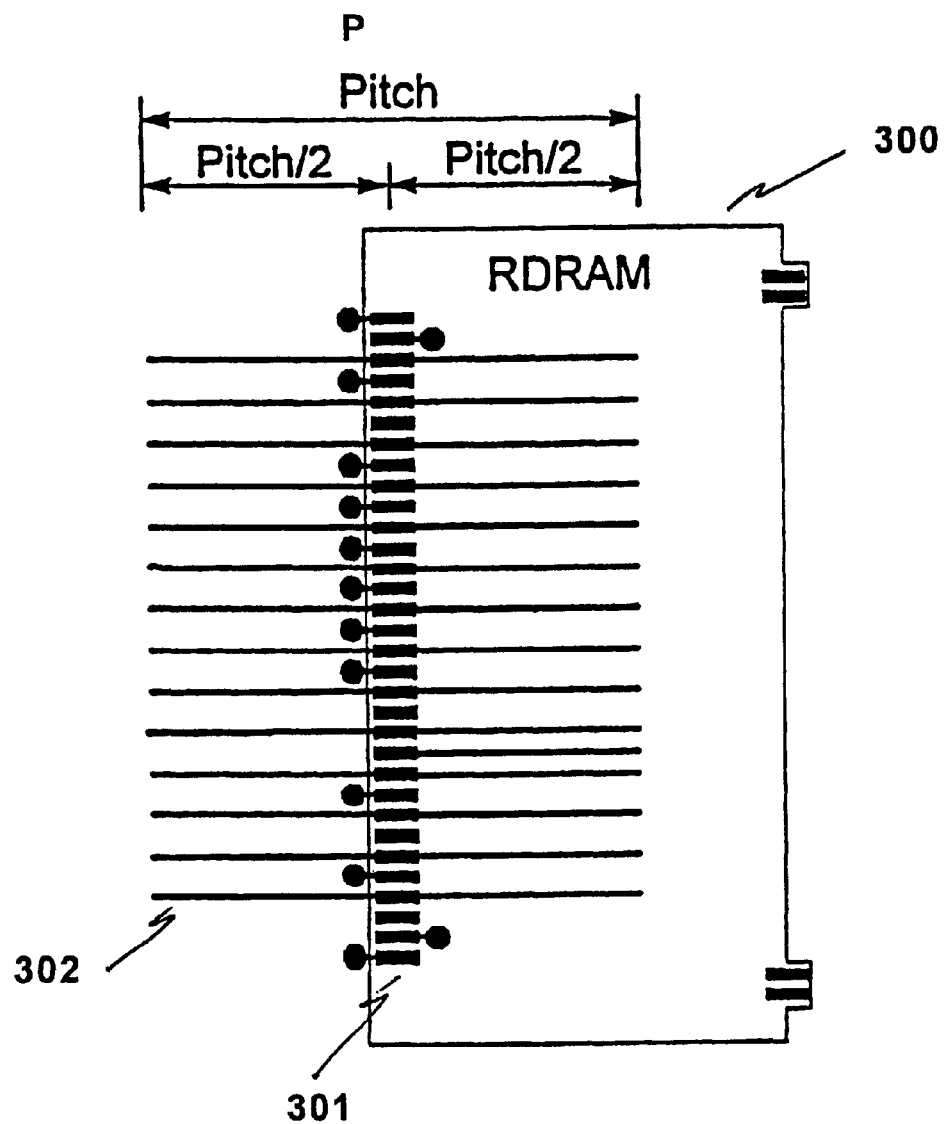
FIG. 1B is a representative drawing of a DRAM connected to a RAMBUS channel.
Figure 2:
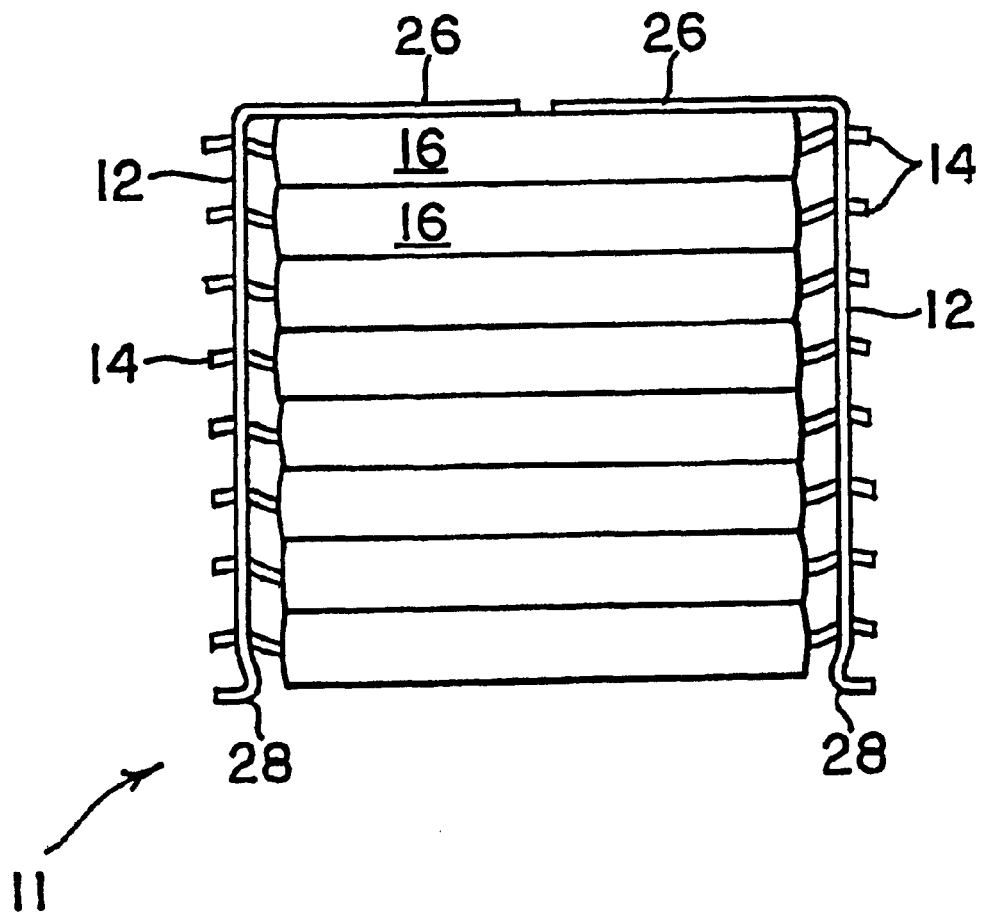
FIG. 2 is a representative diagram of a stacked memory package.
Figure 4:
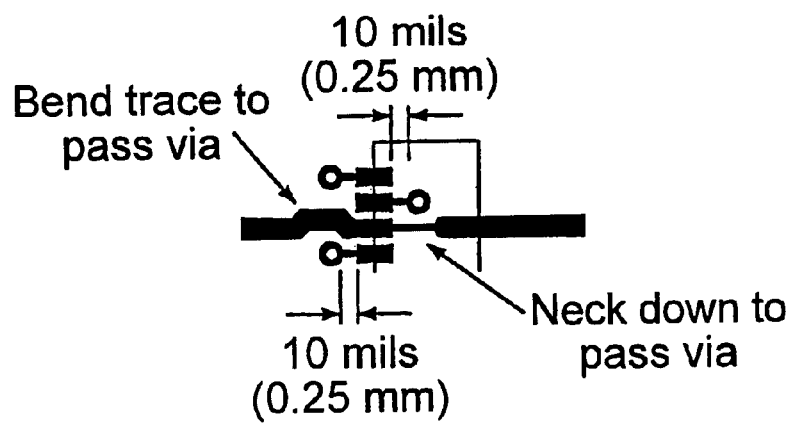
FIG. 4 is an illustration of vias.

FIG. 1B shows the layout of a single DRAM module 300 for a RAMBUS channel. The pads 301 are the points at which the electrical leads of DRAM module 300 contact printed circuit board 5. The horizontal traces 302 are the traces of the RAMBUS channel which connect DRAM module 300 to a microprocessor or memory controller (not shown). Traces 302 are electrically connected to pads 301. Pads 301 are on the upper surface of printed circuit board 5. Those traces of traces 302 that are signal traces, rather than ground or power traces, will also be located on the upper surface of printed circuit board 5. This is so because vias are not allowed to connect signal traces to a DRAM in a RAMBUS channel. Connections to power and ground can be through vias, as shown in FIG. 4.

The pitch parameter, denoted as P in FIG. 1B, is determined by formulas known to persons of ordinary skill in the art, given a desired trace width and dielectric thickness, to achieve an impedance consistent with RAMBUS requirements so that the combined impedance of the RAMBUS channel with the DRAM installed is in the range of 25–50 Ohms. These formulas are given in I. J. Bahl and Ramesh Garg, "Simple and accurate formulas for microstrip with finite strip thickness," *Proc. IEEE*, 65, 1977, pp. 1611–1612; see also T. C. Edwards, "Foundations of Microstrip Circuit Design," John Wiley, New York, 1981, reprinted 1987.

Fortunately, there exist software programs which allow the designer to enter parameters in a spreadsheet format and compute the resulting channel impedance. One such program is provided by RAMBUS, Inc. as an aid to designers who desire to use the high speed DRAMs designed by RAMBUS, Inc. As an example, a dielectric thickness of 11 mils and a minimum trace width of 7 mils results in a pitch of 620 mils.

The pitch segment of length P of traces 302 are centered on pads 301 as shown in FIG. 1B. Thus, it is clear that to make the embodiments of the present invention shown in FIGS. 3A and 3B, it is merely necessary to design the pitch about equal to the distance L shown in FIG. 3A. As an example, setting the pitch to equal L=450 mils, and setting the minimum trace width equal to 4 mils results in a dielectric thickness of 15 mils. The resulting 100 Ohm trace appears to be 25 Ohms when the 5 picofarad (pF) loads from the RAMBUS DRAM stack are added. These dimensions are representative only, as other dimension may be desirable depending on the design goals to be achieved. In the general case, by setting the pitch about equal to distance L shown in FIG. 8A, two memory modules may be stacked as shown in FIG. 3A or 3B, while conforming to RAMBUS specifications.

Figure 3:
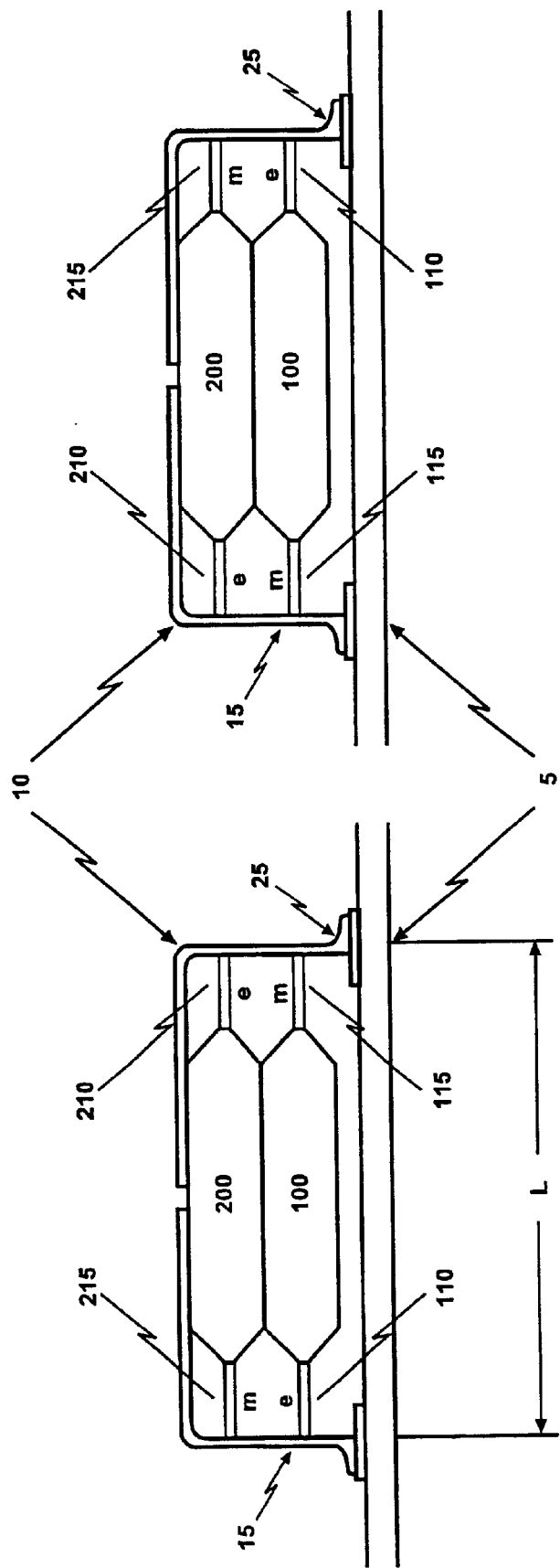
FIGS. 3A and 3B are two representative drawings of preferred embodiments of the present invention.
Figure 5:
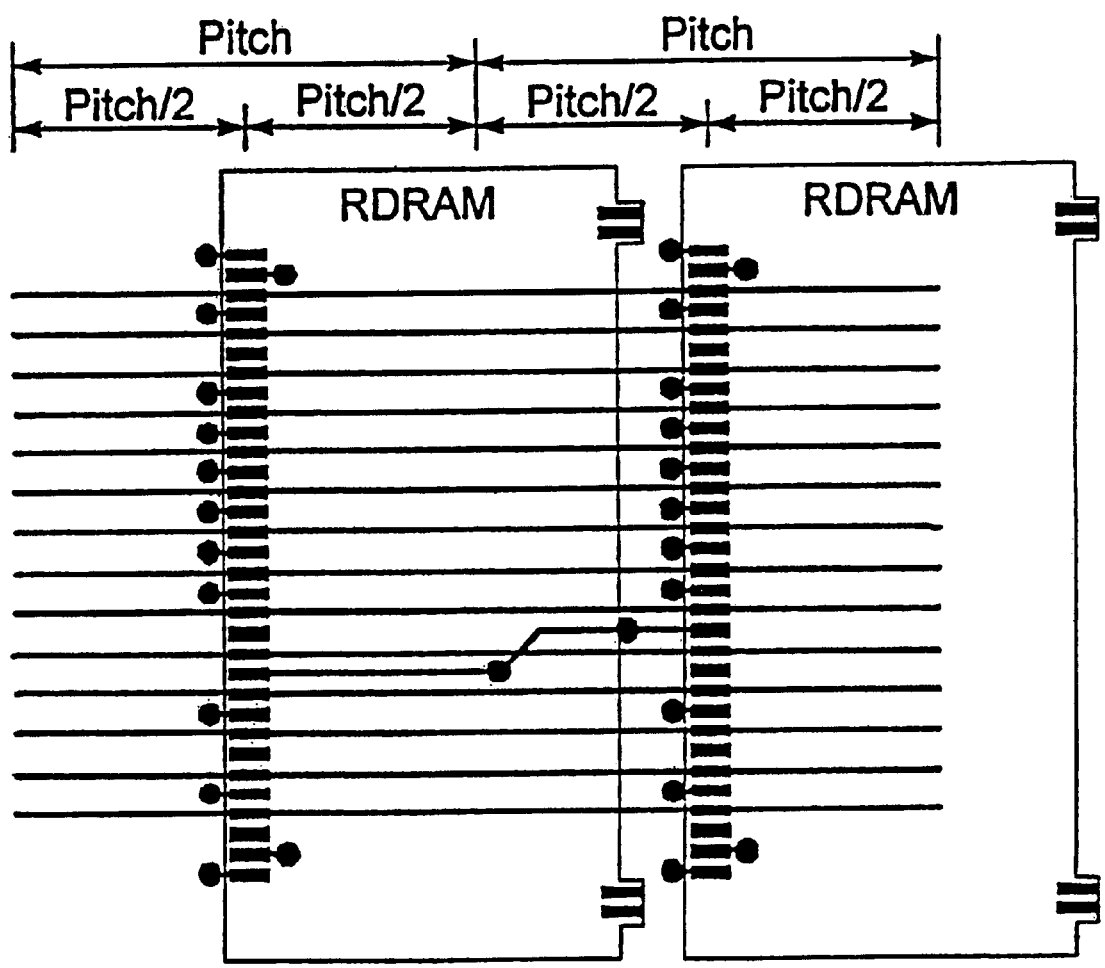
FIG. 5 illustrates parallel connections of conventional single memory modules in a RAMBUS channel.

In contrast, the conventional layout of two unstacked modules mounted side by side as closely as spacing will permit, as shown in FIG. 5, results in consumption of about twice as much board space as the embodiment of the present invention shown in FIG. 3. Thus, two memory modules in a stacked package occupy one-half the board space as two separately mounted DRAM resulting in 100% increase in memory density.

Higher memory density can also be achieved by employing the principles of the present invention to enable close mounting of multiple stacked modules. In FIG. 6A, two stacked modules 10 and 20 are placed physically close together. An equivalent circuit representing this configuration is shown in FIG. 6B (inductance and resistance are not shown), Because two memory modules 10 and 20 are electrically connected to the RAMBUS channel in the vicinity of Point b, the equivalent circuit exhibits twice as much capacitance to the channel at that point. Thus, the RAMBUS channel must be designed to compensate for this additional capacitance so that the equivalent impedance of the channel with the memory modules installed is in the range of 25 to 50 Ohms. This can easily be done utilizing standard formulas and software available in the art. Therefore, employing the principles of the present invention, four memory modules in stacked packages will occupy one-half the board space as four adjacently mounted DRAM.

It will be noted that the number of stacked modules that can be added to the channel will be limited by the ability to implement the channel to match the capacitance of the equivalent circuit to achieve a combined impedance in the range of 25 to 50 Ohms.

Other embodiments of the present invention can be achieved using the stacked package configurations disclosed in the above-mentioned U.S. patents, or as shown in FIG. 7. In each embodiment, RAMBUS channel compatibility is achieved by orienting one of the two memory modules 100 or 200 upside-down with respect to the other as described above. The difference in embodiments arises from the manner in which the leads of memory module 100 and 200 are connected to the traces of the RAMBUS channel on printed circuit board 5. A variety of methods for making these connections are known in the art. Thus, persons of ordinary skill in the art will readily discern that the principles of the present invention may be applied in a variety of ways to achieve higher memory density compatible with RAMBUS channel requirements. Further, given the principles of the present invention as disclosed herein, increased memory density can be achieved for other high speed channels. Moreover, designing the impedance of the signal lines to obtain a combined impedance of the lines and the memory modules that is in a desired range other than 25 to 50 Ohms is achievable given the disclosure herein.

Clearly, changes can be made in the above-described details without departing from the underlying principles of the present invention. A description of a particular embodiment does not determine the scope of an invention. Rather, the scope of the present invention is determined by the following claims.

What is claimed is:

1. A method for manufacturing a high density stacked memory package for use in a high speed memory channel, the method comprising the steps of:

providing first and second packaged integrated circuits encased in packages each having an upper surface, a lower surface and a four-sided perimeter wall from which emerge from opposite sides, electrical leads, an identified one of which leads emerges from a first side of the four-sided perimeter wall; and disposing the second packaged integrated circuit in relation to the first packaged integrated circuit to create a stacked package in which the identified lead of the first packaged integrated circuit is on the opposite side of the stacked package from the identified lead of the second packaged integrated circuit and the upper surface of the first packaged integrated circuit is closer to the upper surface of the second packaged integrated circuit than the lower surface of the second packaged integrated circuit.

2. The method of claim 1 further comprising electrically connecting the electrical leads of the first and second packaged integrated circuits to signal lines of the high speed memory channel to increase memory density in a high speed memory channel.

3. A method for manufacturing a high density memory module compatible with an impedance controlled high speed memory channel, the method comprising the steps of:

providing first and second packaged memory circuits each having electrical leads emergent from their respective packages;

securably connecting the first and second packaged memory circuit electrical leads to signal conveying vertical rails to create a high density memory module that places the first and second packaged memory circuits in an oppositely disposed relationship that locates electrical leads of the first packaged memory circuit on a memory module side opposite that side of the memory module where corresponding electrical leads of the second packaged memory circuit are located.

4. The method of claim 3 in which all electrical leads of the first and second packages are emergent from a selected side of the respective packages and a set of non-electrical mechanical leads are emergent from the side opposite of the electrical lead-emergent side of the first and second packages.

5. A method of increasing memory density in a high speed memory channel comprising the steps of:

providing a plurality of high density memory modules according to the method of claim 3;

mounting each of the modules physically close to at least one other such module and designing the memory channel so that the combined impedance of the channel and modules is within a desired range.

6. A high density memory device compatible with a high speed memory channel, comprising:

a first module in which its electrical leads extend from a first side of said first module;

a second module disposed in relation to the first module so that the second module's electrical leads extend from a side of said second module opposite said first side of said first module;

wherein one or more of said electrical leads of said first module are electrically connectable to signal lines of said memory channel; and wherein one or more of said electrical leads of said second module are electrically connectable to said signal lines of said memory channel; and wherein the combined impedance of said lines and said first and second modules is within a desired range.

* * * * *